United States Patent [19]

Pulker et al.

[11] 4,254,159

[45] Mar. 3, 1981

[54] METHOD OF PRODUCING GOLD-COLOR COATINGS

[75] Inventors: Hans K. Pulker, Tiesen, Liechtenstein; Helmut Daxinger, Wangs, Switzerland

[73] Assignee: Balzers Aktiengesellschaft für Hochvakuumtechnik und Dünne Schichten, Liechtenstein

[21] Appl. No.: 971,327

[22] Filed: Dec. 20, 1978

[30] Foreign Application Priority Data

Dec. 23, 1977 [CH] Switzerland ............... 015934/77

[51] Int. Cl.³ .............................................. B05D 3/06
[52] U.S. Cl. ....................................... 427/38; 204/177
[58] Field of Search ................... 427/38, 39; 204/164, 204/177

[56] References Cited

U.S. PATENT DOCUMENTS

| | | | |
|---|---|---|---|
| 3,900,592 | 8/1975 | Kennedy et al. | 427/39 |
| 3,953,619 | 4/1976 | Matsubara | 427/39 |

FOREIGN PATENT DOCUMENTS 2410483  9/1974  Fed. Rep. of Germany ............ 427/39

OTHER PUBLICATIONS

Roikh et al., "Zashchita Metalov", V13, No. 6, Nov.–Dec. 1977, (English Translation Protection of Metals) pp. 545–555.

Primary Examiner—John H. Newsome
Attorney, Agent, or Firm—McGlew and Tuttle

[57] ABSTRACT

A method of producing gold-color coatings on substrates by evaporating a coating material comprising a metallic titanium or zirconium in a housing which has walls which define an evaporation space, comprises, maintaining a vacuum atmosphere containing $N_2$ and argon in the space. The method is carried out using an anode connected to a power source to produce a low voltage arc discharge in the vicinity of the coating material which is arranged within the evaporation space and also maintaining a low voltage arc between the anode and the substrates. A potential difference between the anode and the substrates of a-range of between 5 v and 100 v are maintained during the process and, in addition, the electrical potential of the substrates is maintained between 0 and 150 volts lower than the potential of the housing walls which define the evaporation space. The substrate to be coated is coated at a rate of from between 1 to 15 nanometers per second. The $N_2$ and argon atmosphere is maintained so that a partial pressure of the $N_2$-containing component ranges between $2 \times 10^{-4}$ and $10^{-2}$ millbar. The potential difference between the anode and the substrates is reduced in the course of the process to release the sputtering threshold of the substrate and the housing wall. The partial pressure of the $N_2$-containing components continuously increase in the course of the process.

3 Claims, 1 Drawing Figure

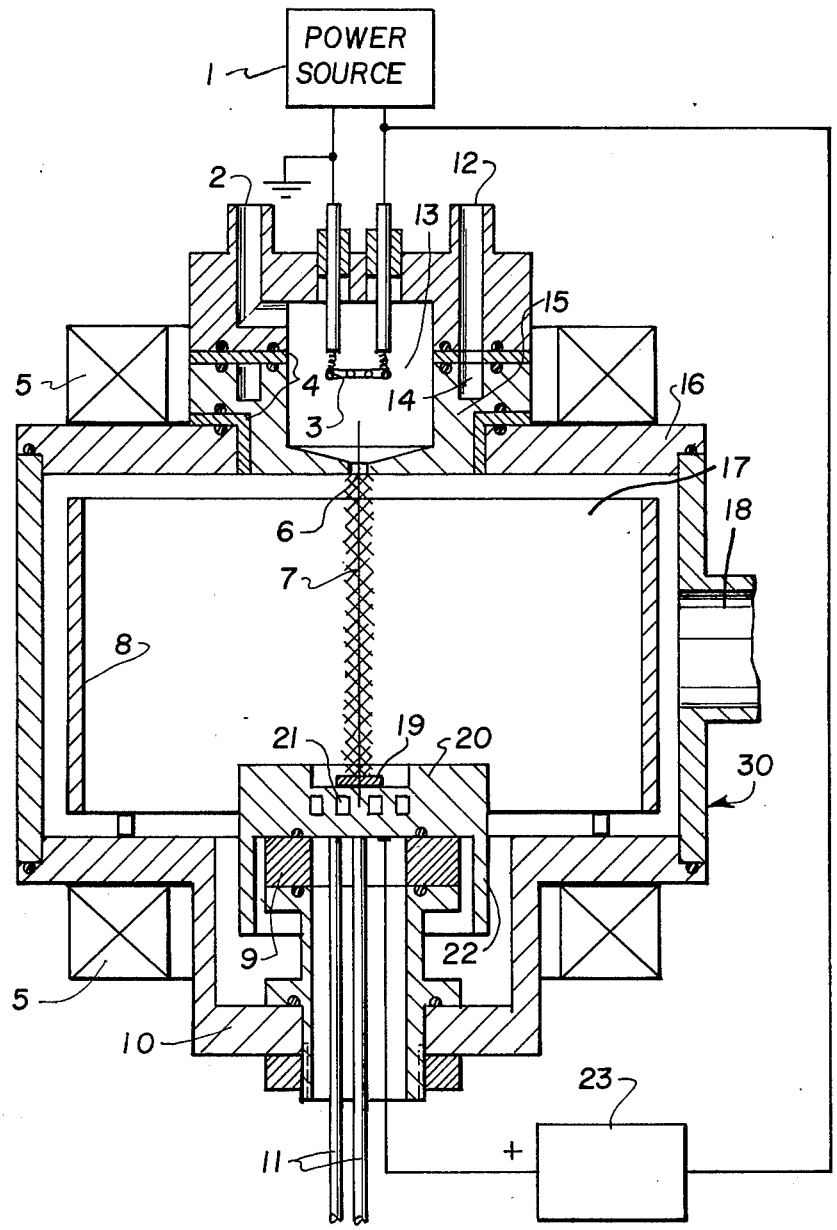

METHOD OF PRODUCING GOLD-COLOR COATINGS

FIELD AND BACKGROUND OF THE INVENTION

This invention relates to methods of producing coatings on substrates by vapor deposition in general and, in particular, to a new and useful method of producing gold-color coatings on substrates.

DESCRIPTION OF THE PRIOR ART

The production of coatings on substrates by reactive ion plating (ion supported vapor deposition) in a vacuum is known. The so-called low voltage arc discharge has proven to be particularly suitable for evaporation purposes in cases where too strong a heating of the substrates is to be prevented. That is, due to the strong activation of the reactants in the low-voltage arc, a satisfactory reaction is obtained even on cooled substrates, which is not easy to obtain with other methods of reactive deposition. A problem which still arises in this connection is the frequently unsatisfactory adhesive strength of the coatings. The adhesive strength is unsatisfactory particularly in instances where a small potential difference is maintained between the substrates and the anode in order to avoid an undue temperature increase.

SUMMARY OF THE INVENTION

The present invention is directed to a method of producing gold-color coatings on substrates which meets the requirement of having a very high adhesive strength and which are reproducible with invariably high accuracy in steady hues. This last-mentioned feature is of particular importance in the manufacture of gold-color parts, for example, since here the sales are to be made while observing very exacting tolerance ranges. More particularly, the invention is directed to the production of coatings which equal, to a large extent, the gold color hues which are customary in the watch-making industry, with the objective of reducing the reject rate and increasing the economy of manufacture as compared to the conventional manufacturing methods.

The invention is further directed at a particularly careful treatment of substrates during the coating which permits use of even substrates which in view of their sensitivity to heat cannot be coated in the usual manner, for example, by means of chemical vapor deposition processes (CVD). This particularly involves hard-chromium plating where the layer loses its hardness at temperatures exceeding 400° C. Other substrates sensitive to heat are alloys, such as brass, as well as some plastics.

In accordance with the method of the invention, gold-color coatings are produced on substrates by evaporating a coating material of metallic titanium or zirconium in a housing having walls which define an evaporation space. The evaporation space is maintained in a vacuum atmosphere containing $N_2$ and argon using an anode connected to a power source to produce a low voltage arc discharge in the vicinity of the coating material and between the anode and the substrates. The potential difference between the anode and the substrates is maintained in the range of between 5 and 100 volts and the electrical potential of the substrates is maintained from between 0 to 150 volts lower than the potential of the housing walls which define the evaporation space. The coating of the substrate is carried out at a rate of from between 1 to 15 nanometers per second. The $N_2$ and argon atmosphere is maintained so that the partial pressure of the $N_2$-containing component ranges between $2 \times 10^{-4}$ and $10^{-2}$ millibars.

Accordingly, an object of the present invention is to provide a method of producing gold-color coatings using a coating material of metallic titanium or zirconium and in a vacuum evaporation system wherein a potential is maintained between the anode and the substrates which is of a range of between 5 and 100 volts and the electrical potential of the substrates is maintained from 0 to 150 volts lower than the potential of the housing walls which define the evaporation space and the substrate coating is carried out at from between 1 to 15 nanometers per second and the atmosphere is regulated so as to maintain the nitrogen and argon atmosphere so that the partial pressure of the $N_2$-containing component ranges from between $2 \times 10^{-4}$ and $10^{-2}$ millibars.

A further object of the present invention is to provide a method of producing gold-color coatings on substrates which is simple in concept, easy to execute and inexpensive to carry out. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWING

The only FIGURE of the drawing is a transverse sectional view of a device for producing gold-color coatings in accordance with the method of the present invention.

DESCRIPTION OF THE PREFERRED EMBODIMENT

Referring to the drawing in particular, the invention embodied therein, comprises, a method of producing gold-color coatings on substrates which are mounted on a structural support 8 in a housing, generally designated 30, and using a metallic titanium and/or zirconium which is placed in a crucible along an axis of discharge of a hot cathode 3.

Housing 30 comprises a vacuum chamber 17 provided with an exhaust connection 18 and communicating through an aperture 6 with a hot-cathode chamber 13. This chamber 13 accommodates a hot cathode 3 which is supplied with current from a power source 1. The housing 30 includes a bottom part or lower evaporation chamber 10 in which there is a crucible 20 for the evaporative material 19 which can be cooled by means of coolant channels 21 and supply and return lines 11 for the coolant. The evaporation chamber accommodates a supporting structure 8 for the substrates to be coated by evaporation, in the shape of a cylindrical wall. The hot-cathode chamber is provided with a gas inlet 2 and a coolant channel 14 which latter is intended particularly for cooling the partition between the hot-cathode chamber and the evaporation chamber during operation. To produce a magnetic field in the evaporation space, which would be approximately parallel to the discharge axis 7, field coils 5 are provided outside the bottom part 10 and also outside of a top cover part 16 of the housing 30.

To carry out the inventive method, the substrates to be coated are secured to the side of support 8 facing the vapor source and the discharge axis 7. The evaporative material 19 is placed in the crucible 20, which acts as an anode powered by source 23, and the evaporation chamber is closed and evacuated. A nitrogen-containing gas in mixture with argon is introduced into the hot-cathode chamber through the gas inlet 2. It is also possible, however, in order to preserve the hot cathode 3, to introduce the argon into the hot-cathode chamber 13 through a separate line and, in order to obtain the desired reaction in the evaporation space, to introduce the nitrogen-containing gas therein through another separate line, so that during the evaporation, a reactive residual gas atmosphere prevails in the evaporating space, the pressure of which can be adjusted by continuous pumping to a value optimal for the provided process.

In accordance with an example of the inventive method, in order to produce gold-color titanium nitride layers, metallic titanium in lumps has been placed in the crucible 20, the apparatus was then evacuated to $10^{-5}$ millibar and nitrogen was introduced into evaporation chamber 17 through the gas inlet 2 into the hot-cathode chamber 13 and through the aperture 6 into the chamber 17, and continuously evacuated through the evacuation connection 18 at a rate to maintain a pressure of $5 \times 10^{-2}$ mb in the hot-cathode chamber and an $N_2$ partial pressure of between $2 \times 10^{-2}$ and $10^{-2}$ millibar in the evaporation chamber. The hot cathode was then heated with 1.5 kW and a voltage of $+100$ volts was applied to the anode and $-100$ volts to the substrates.

By briefly applying an anode voltage to a partition 15 between the hot-cathode chamber 13 and the evaporation chamber 17, the low-voltage arc was struck. (The voltage indications above and in the following are potential differences relative to the container to which ground potential is applied.) Partition 15 is insulated from the container housing 30 and the cathode support by seals 4. The result was a 100 A current flowing through the hot cathode. The current flowing through the anode 20 was 120 A. Anode crucible 20 is insulated from the surrounding supports by insulating ring 9. The difference of 20 A between the two currents equalled the current flowing through the substrates and the container.

By the stream of electrons flowing to the crucible 20 as the anode, the titanium placed therein was melted and evaporated at a rate of about 0.4 g per minute. Under the action of the residual gas which was strongly ionized by the low-voltage arc discharge between the hot cathode and the anode, a hard titanium nitride layer of gold-yellow color and extreme adhesive strength has been obtained on the substrates (not shown) which were secured to support 8. In other experimental processes taken as example, in which in every instance, the titanium evaporation rate has been adjusted to obtain on a test glass a deposit of 0.33 μm in thickness per minute and the substrate voltage was $-40$ volt and the argon partial pressure $1.6 \times 10^{-3}$ millibar, the following hues have been substantially approximated:

(1) jaune-pale1N-14(*) with $P_{N2} = 0.2 \times 10^{-3}$ mbar
(2) jaune-pale2N-18(*) with $P_{N2} = 0.4 \times 10^{-3}$ mbar
(3) jaune3N(*) with $P_{N2} = 0.6 \times 10^{-3}$ mbar
(4) rose4N(*) with $P_{N2} = 0.7 \times 10^{-3}$ mbar
(5) rouge5N(*) with $P_{N2} = 0.8 \times 10^{-3}$ mbar
   (*) Designation of hue according to Normalisation Industrielle de l'Horlogerie Suisse NIHS—0-3-50.

As may be learned from the foregoing examples, the hue can be adjusted accurately by suitably adjusting the $N_2$ partial pressure.

In order to obtain a surface with the desired hue, it is usually sufficient to produce only the uppermost partial layers of the coating exactly with the corresponding color, i.e., with the indicated voltage values and partial pressures, while the deeper partial layers closer to the substrate surface may be deposited under conditions which differ therefrom. It may be purposeful, for example, to initially apply a higher potential difference between anode and substrates, to impart a higher energy to the particles impinging on the substrate surface and to thereby obtain a better bond and adhesive strength, and then to gradually reduce the potential difference during the deposition of further partial layers of the coating, at least to the so-called sputtering threshold of the substrate and/or the container wall. By sputtering threshold, the potential difference is understood above which a sputtering of the substrate or of the material constituting the container wall is possible. It should be mentioned that a higher potential difference has the effect of deepening the color.

During the production of these coatings, it was possible to keep the temperature continually below 380° C., and, in most cases, even at a substantially lower level. High-gloss coatings have been obtained in instances where the substrate surfaces to be coated have been polished in advance, so that subsequent treatment was unnecessary. All coatings exhibited a hardness of more than 2000 kg mm$^{-2}$, according to the Vickers test.

Since $N_2$ is consumed by the nitride formation, it is advisable to keep the $N_2$ partial pressure constant to continuously introduce into the hot-cathode chamber the $N_2$-containing gas in such an amount that in the order of magnitude, the mean free path of the gas molecule in this chamber becomes equal to the cathode fall distance of the low-voltage arc discharge. Arc voltages of less than 200 volt are recommended for the discharge, but with currents of at least 30A.

It is further advisable to electrically insulate the partition 15 in which the aperture between the hotcathode chamber and the evaporation space is provided, and to keep it at a floating voltage. Either a positive or the ground potential may be applied to the evaporative material, with the ground or a negative potential applied to the cathode. An operation with both the cathode and the evaporative material at a positive potential relative to the ground is also possible. The substrates to be coated are always at a negative potential relative to the anode, and they may, in addition, be temporarily (in particular intermittently) connected as the cathode of an independent gas discharge.

While a specific embodiment of the invention has been shown and described in detail to illustrate the application of the principles of the invention, it will be understood that the invention may be embodied otherwise without departing from such principles.

What is claimed is:

1. A method of producing gold-color coatings on substrates by evaporating a coating material of metallic titanium or zirconium in a housing having walls defining an evaporation space with a vacuum atmosphere containing $N_2$ and argon and using an anode connected to a power source to produce a low voltage arc discharge in the vicinity of the coating material and between the anode and a cathode, comprising, maintaining a potential difference between the anode and the substrates with the anode positive with respect to the substrates of a range of from between 5 and 100 volts, maintaining the electrical potential of the substrates between from 0 to 150 volts lower than the potential of the housing walls defining the evaporation space, coating the substrate at a rate of from between 1 and 15 nanometers per second, and maintaining the $N_2$ and argon atmosphere so that the partial pressure of the $N_2$-containing component ranges between $2 \times 10^{-4}$ and $10^{-2}$ millibars.

2. A method of producing gold-color coatings, as claimed in claim 1, wherein the potential difference between the anode and the substrates is reduced in the course of the process to at least the sputtering threshold of the substrate and/or the housing walls defining the evaporation space.

3. A method of producing gold-color coatings, as claimed in claim 1, wherein the partial pressure of the $N_2$-containing component is continuously increased in the course of the process.

* * * * *